(12) United States Patent
Krainer et al.

(10) Patent No.: US 10,823,766 B2
(45) Date of Patent: Nov. 3, 2020

(54) DETECTOR AND A VOLTAGE CONVERTER

(71) Applicant: Infineon Technologies Austria AG, Villach (AT)

(72) Inventors: Siegfried Krainer, Villach (AT); Wolfgang Marbler, Treffen (AT); Wolfgang Granig, Seeboden (AT)

(73) Assignee: Infineon Technologies Austria AG, Villach (AT)

( * ) Notice: Subject to any disclaimer, the term of this patent is extended or adjusted under 35 U.S.C. 154(b) by 36 days.

(21) Appl. No.: 16/166,759

(22) Filed: Oct. 22, 2018

(65) Prior Publication Data

US 2019/0056433 A1 Feb. 21, 2019

Related U.S. Application Data

(62) Division of application No. 13/939,646, filed on Jul. 11, 2013, now Pat. No. 10,132,843.

(51) Int. Cl.
| | | |
|---|---|---|
| *G01R 19/00* | (2006.01) | |
| *H02M 3/335* | (2006.01) | |
| *G01R 15/20* | (2006.01) | |
| *G01R 33/09* | (2006.01) | |
| *H01L 43/02* | (2006.01) | |
| *H02M 1/00* | (2006.01) | |

(52) U.S. Cl.
CPC ....... *G01R 19/0092* (2013.01); *G01R 15/205* (2013.01); *G01R 33/09* (2013.01); *H01L 43/02* (2013.01); *H02M 1/00* (2013.01); *H02M 3/33592* (2013.01); *H02M 2001/0009* (2013.01); *Y02B 70/1475* (2013.01)

(58) Field of Classification Search
CPC .. G01R 19/0092; G01R 15/205; G01R 33/09; H01L 43/02; H02M 1/00; H02M 3/33592; H02M 2001/0009; Y02B 70/1475

See application file for complete search history.

(56) References Cited

U.S. PATENT DOCUMENTS

| | | |
|---|---|---|
| 4,447,781 A | 5/1984 | van Dyke |
| 4,837,426 A | 6/1989 | Pease et al. |

(Continued)

FOREIGN PATENT DOCUMENTS

| | | |
|---|---|---|
| CN | 1659444 A | 8/2005 |
| CN | 102812367 A | 12/2012 |

(Continued)

OTHER PUBLICATIONS

Office Action dated Sep. 1, 2016 for Chinese Patent Application No. 201410329729.3.

(Continued)

*Primary Examiner* — Jue Zhang
(74) *Attorney, Agent, or Firm* — Schiff Hardin LLP

(57) ABSTRACT

A detector for detecting an occurrence of a current strength of interest (e.g. zero current) of a current of a signal to be sensed includes a magnetoresistive structure and a detection unit. The magnetoresistive structure varies a resistance depending on a magnetic field caused by the current of the signal to be sensed. Further, the detection unit generates and provides a current detection signal indicating an occurrence of the current strength of interest based on a detected magnitude of the varying resistance of the magnetoresistive structure.

20 Claims, 9 Drawing Sheets

(56) References Cited

U.S. PATENT DOCUMENTS

| | | | |
|---|---|---|---|
| 4,876,497 | A | 10/1989 | Colver |
| 5,696,445 | A | 12/1997 | Inbar |
| 6,043,633 | A | 3/2000 | Lev et al. |
| 6,263,247 | B1 | 7/2001 | Mueller et al. |
| 6,714,006 | B2 | 3/2004 | Mackay et al. |
| 7,928,719 | B2 | 4/2011 | Zhang et al. |
| 8,026,704 | B2 | 9/2011 | Kapels et al. |
| 8,084,952 | B1 | 12/2011 | Shiwei et al. |
| 8,339,843 | B2 | 12/2012 | Katti |
| 9,054,546 | B2 | 6/2015 | Zhao |
| 9,170,281 | B2 | 10/2015 | Hayashi et al. |
| 10,132,843 | B2 | 11/2018 | Krainer et al. |
| 2002/0057156 | A1 | 5/2002 | Czimmek |
| 2003/0231077 | A1 | 12/2003 | Nuspl et al. |
| 2007/0108975 | A1 | 5/2007 | Desplats et al. |
| 2007/0200564 | A1 | 8/2007 | Motz et al. |
| 2010/0164512 | A1 | 7/2010 | Kiss et al. |
| 2010/0225350 | A1 | 9/2010 | Hoeink et al. |
| 2011/0199078 | A1 | 8/2011 | Ezekwe et al. |
| 2011/0267015 | A1 | 11/2011 | Lu et al. |
| 2012/0285620 | A1* | 11/2012 | Larson ............... H01J 37/32944 156/345.28 |
| 2012/0326703 | A1* | 12/2012 | Hayashi ................ B82Y 25/00 324/126 |

FOREIGN PATENT DOCUMENTS

| | | |
|---|---|---|
| DE | 102006022336 A1 | 9/2007 |
| JP | H08-304479 A | 11/1996 |

OTHER PUBLICATIONS

Office Action dated Mar. 27, 2017 for German Patent Application No. 10 2014 109 646.0.

Office Action dated Mar. 27, 2017 for German Patent Aoolication No. 10 2006 022 336.

Y.-S. Roh, Y.-J. Moon, J.-C. Gong, and C. Yoo, "Active Power Factor Correction (PFC) Circuit with Resistor-Free Zero-Current Detection," IEEE Transactions on Power Electronics, vol. 26, pp. 630-637, Feb. 2011.

W.-C. Cheng and C.-L. Chen, "A Zero-Current Detection Circuit with Optimal ZVS/VS for Boundary Mode boost PFC Converter" 2012 IEEE International Symposium on Industrial Electronics (ISIE), pp. 137-142.

Kolar, Johann W. High-Performance Rectifier System with 99.2% Efficiency, 5 pages, Mar. 2012.

S. E. Russek, J. 0. Oti, Shehzaad Kaka, and Eugene Y. Chen, "High-speed Characterization of Submicrometer Giant Magnetoresistive devices," J. Appl. Phys. 85, 4773, 1999.

J. Pelegri, J.B. Ejeab, D. Ramirezb, P.P. Freitasc, "Spin-Valve Current Sensor for Industrial Applications", Sensors and Actuators A: Physical, vol. 105, Issue 2, Jul. 15, 2003, pp. 132-136.

Infineon, Wheel Speed Sensor: iGMR based Wheel Speed Sensor, TLE54041 plusC, 27 pages, dated Apr. 20 13.

Schneider, Robert W., "Low Magnetic Field Sensing with GMR Sensors, Part 2: GMR Sensors and Their Applications," 14 pages, Oct. 1, 1999.

Fu, Dianbo "Topology Investigation and System Optimization of Resonant Converters," Feb. 4, 2010, 211 pages.

Infineon, "Current Sensing Using Linear Hall Sensors," Feb. 2009, Rev. 1.1, 18 pages.

* cited by examiner

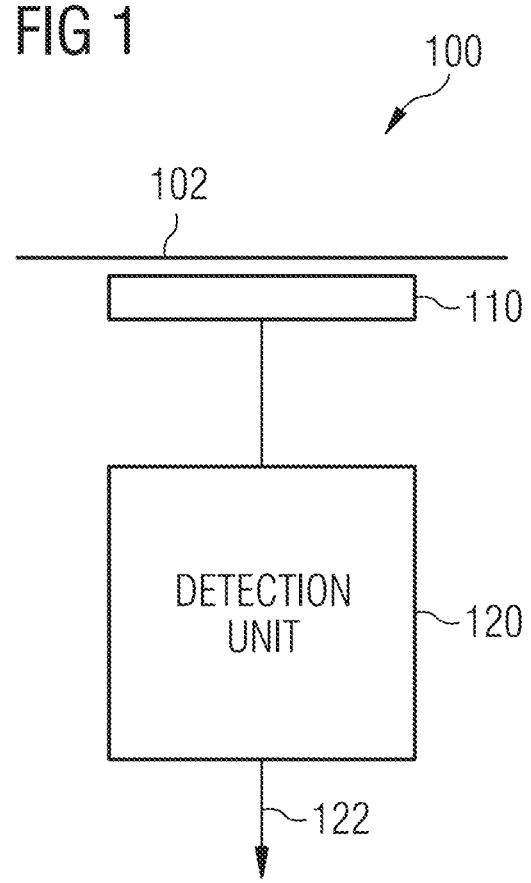

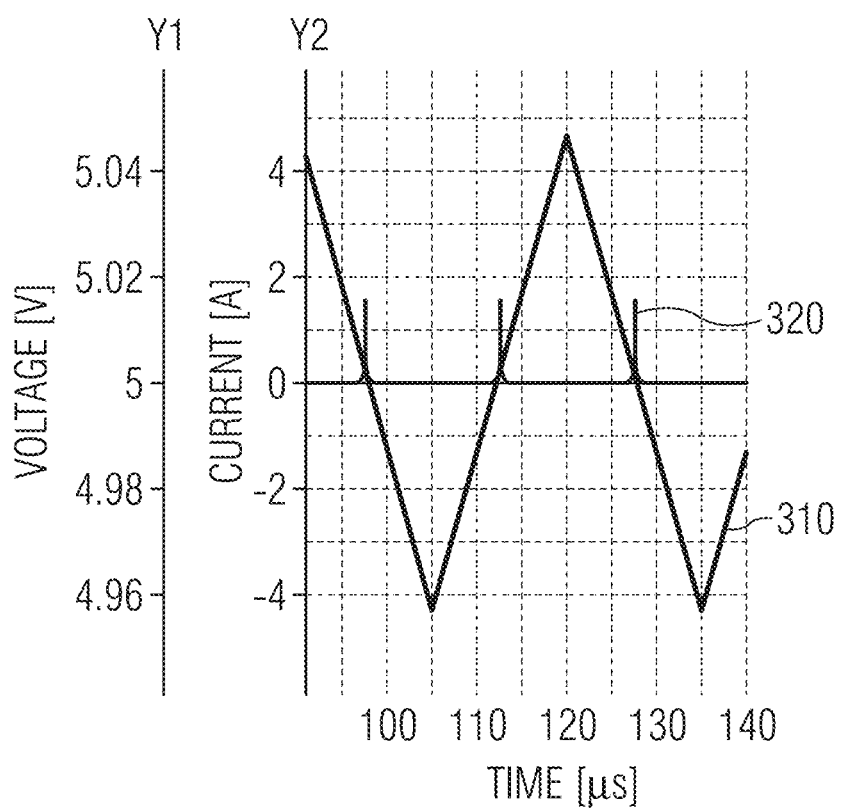

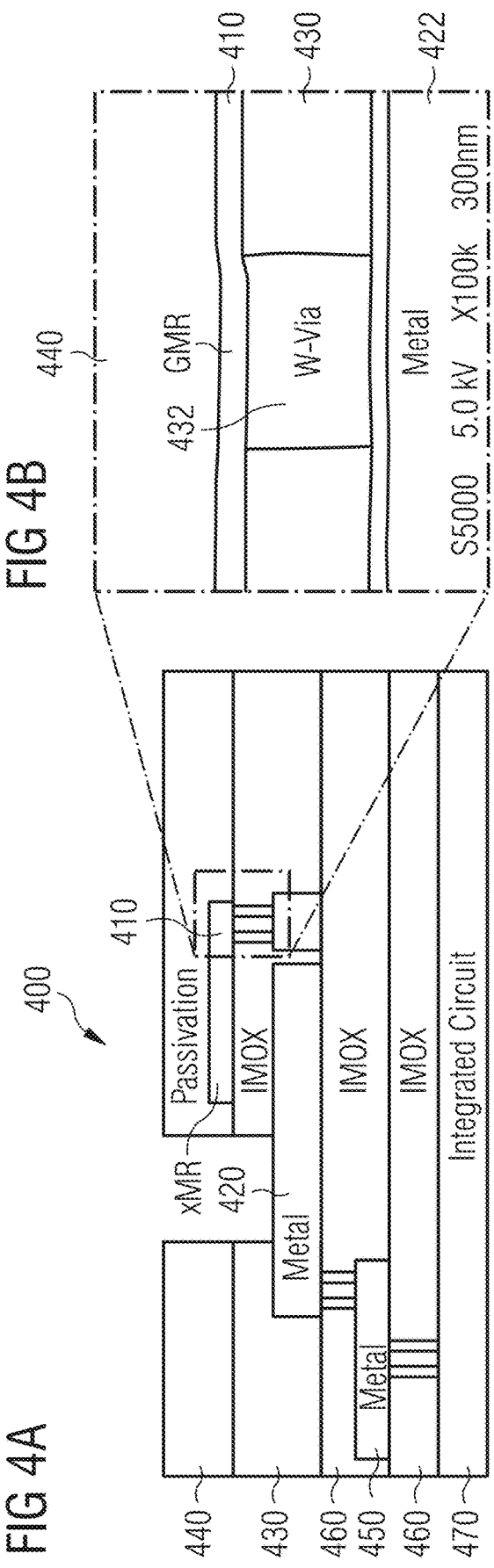

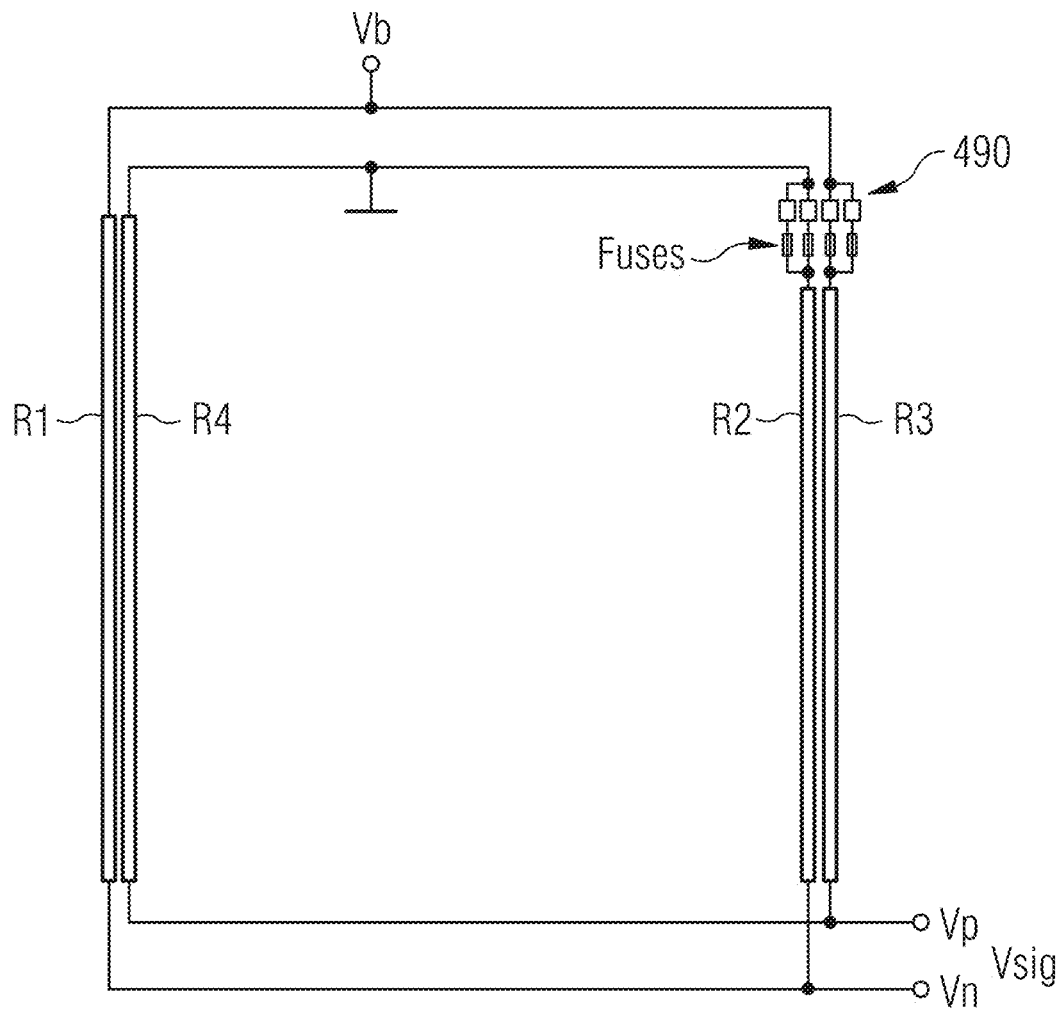

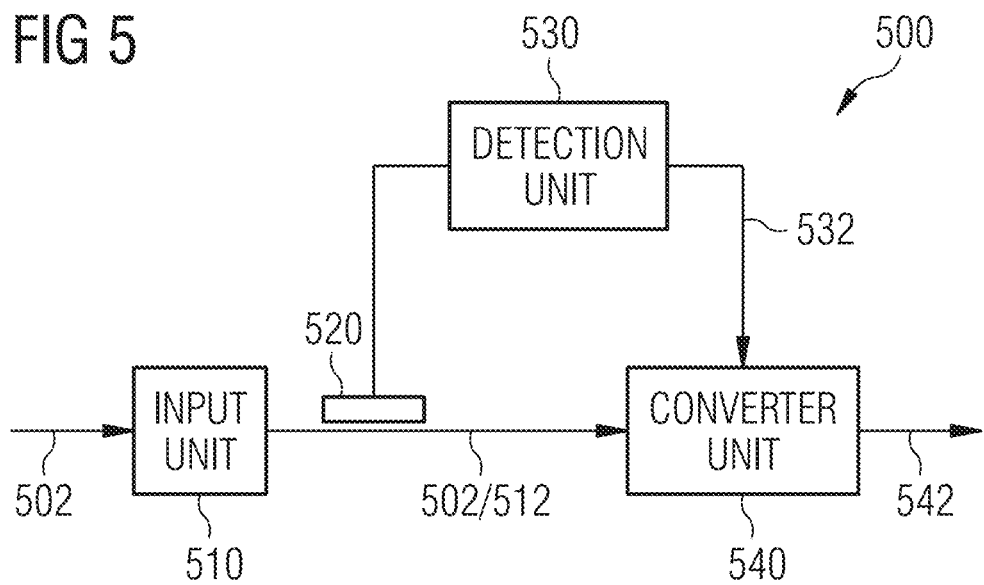

DETECTOR AND A VOLTAGE CONVERTER

CROSS REFERENCE TO RELATED APPLICATIONS

This is a divisional patent application of U.S. patent application Ser. No. 13/939,646, filed Jul. 11, 2013, and entitled "DETECTOR AND A VOLTAGE CONVERTER," issued as U.S. Pat. No. 10,132,843 on Nov. 20, 2018, which is incorporated herein by reference in its entirety.

BACKGROUND

Field

Embodiments relate to the field of current detection concepts and in particular to a detector, a voltage converter and a method for carrying out a current detection.

Related Art

A reliable and accurate detection of the occurrence of a current strength of interest within signals is an important task in many applications. For example, the always increasing requirements in the area of power electronics lead to higher switching frequencies and more complex topologies. If it can be guaranteed that a power switch can be switched only at the zero crossing of a current, a possibility of constructing extremely efficient voltage converters can be provided. A necessary temporal sample rate of a few nanoseconds resulting from a corresponding resolution of the signal shape is caused by the switching frequencies getting in the region of megahertz. In other words, the zero current crossing (zero current detection, ZCS) in modern, high efficient, switched electric voltage converter should be measured accurate and very fast.

SUMMARY

An embodiment relates to a detector for detecting an occurrence of a current strength of interest of a current of a signal to be sensed. The detector comprises a magnetoresistive structure and a detection unit. The magnetoresistive structure is configured to vary a resistance depending on a magnetic field caused by the current of the signal to be sensed. The detection unit is configured to generate and provide a current detection signal indicating an occurrence of the current strength of interest based on a detected magnitude of the varying resistance of the magnetoresistive structure.

A magnetoresistive structure comprises a very fast response to varying magnetic fields. Therefore, a very fast current detection can be provided by using a magnetoresistive structure. Consequently, an occurrence of a current of interest can be temporally resolved very accurate. In this way, an accurate zero current detection or a detection of shorts can be implemented, for example. Further, a potential separation can be provided easily. Furthermore, the proposed structure can be implemented with low effort.

Some embodiments relate to a zero current detector for detecting a zero current of a signal to be sensed. The apparatus comprises a magnetoresistive structure and a detection unit. The magnetoresistive structure is configured to vary a resistance depending on a magnetic field caused by a current of a signal to be sensed. The detection unit is configured to generate and provide a zero current detection signal indicating a zero current of the signal to be sensed based on a detected magnitude of the varying resistance of the magnetoresistive structure.

A magnetoresistive structure comprises a very fast response to varying magnetic fields. Therefore, a very fast zero current detection can be provided by using a magnetoresistive structure. Consequently, a zero current crossing can be temporally resolved very accurate. Further, a potential separation can be provided easily. Furthermore, the proposed structure can be implemented with low effort.

In some embodiments, the magnetoresistive structure is implemented, so that the variation of the resistance is based on a giant magnetoresistive effect or a tunnel magnetoresistive effect. Such structures may provide a very high temporal resolution.

In some embodiments, the magnetoresistive structure and an electrically conductive line configured to carry the signal to be sensed are manufactured on the same semiconductor die. In this way, a highly integrated, space saving circuit can be provided.

Some embodiments relates to a voltage converter comprising an input unit, a magnetoresistive structure, a detection unit and a converter unit. The input unit is configured to receive a voltage signal to be converted. The magnetoresistive structure is configured to vary a resistance depending on a magnetic field caused by the voltage signal to be converted or a processed signal obtained by processing the voltage signal to be converted. Further, the detection unit is configured to generate and provide a current detection signal indicating an occurrence of the current strength of interest within the voltage signal to be converted or the processed signal obtained by processing the voltage signal to be converted based on a detected magnitude of the varying resistance of the magnetoresistive structure. The converter unit is configured to covert the voltage signal to be converted or the processed signal obtained by processing the voltage signal to be converted to a converted voltage signal based on the current detection signal.

By using a magnetoresistive structure for detecting an occurrence of a current strength of interest of a voltage signal or a processed voltage signal to be converted, the current can be detected very accurate and with high temporal resolution. Therefore, the voltage signal can be converted with increased efficiency.

Some embodiments relate to a voltage converter comprising an input unit, a magnetoresistive structure, a detection unit and a converter unit. The input unit is configured to receive a voltage signal to be converted. The magnetoresistive structure is configured to vary a resistance depending on a magnetic field caused by the voltage signal to be converted or a processed signal obtained by processing the voltage signal to be converted. The detection unit is configured to generate and provide a zero current detection signal indicating a zero current of the voltage signal to be converted or the processed signal obtained by processing the voltage signal to be converted based on a detected magnitude of the varying resistance of the magnetoresistive structure. Further, the converter unit is configured to convert the voltage signal to be converted or the processed signal obtained by processing the voltage signal to be converted to a converted voltage signal based on the zero current detection signal.

By using a magnetoresistive structure for detecting the zero current of a voltage signal or a processed voltage signal to be converted, the zero current can be detected very accurate and with high temporal resolution. Therefore, the voltage signal can be converted with increased efficiency.

BRIEF DESCRIPTION OF THE DRAWINGS

Some embodiments of apparatuses and/or methods will be described in the following by way of example only, and with reference to the accompanying figures, in which FIG. 1 shows a schematic illustration of a zero current detector.

FIG. 3 shows a schematic illustration of a signal to be sensed and a resulting zero current detection signal.

FIG. 4a shows a schematic cross-section of a semiconductor die with a magnetoresistive structure.

FIG. 4b shows an electron microscope image of a detail of the cross-section of FIG. 4a.

FIG. 4c shows a schematic illustration of a magnetoresistive structure.

FIG. 5 shows a schematic illustration of a voltage converter.

FIG. 7b shows possible positions for a magnetoresistive structure in the part of the voltage converter shown in FIG. 7a.

DETAILED DESCRIPTION

Figure 2A:
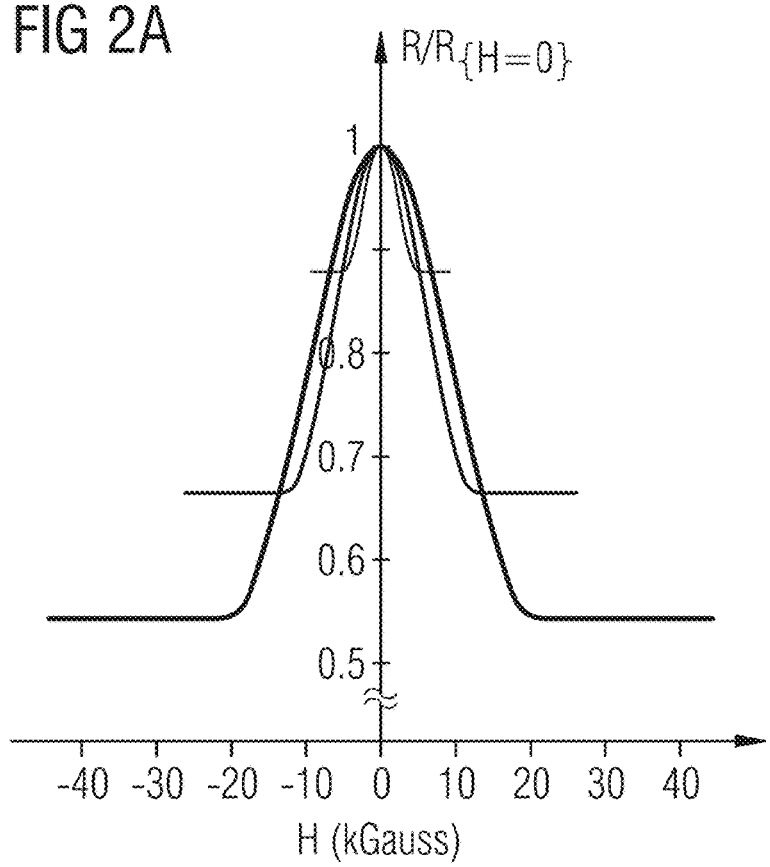
FIG. 2a shows a schematic illustration of a resistance of a magnetoresistive structure varying depending on an applied magnetic field.

Various example embodiments will now be described more fully with reference to the accompanying drawings in which some example embodiments are illustrated. In the figures, the thicknesses of lines, layers and/or regions may be exaggerated for clarity.

Accordingly, while example embodiments are capable of various modifications and alternative forms, embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

FIG. 1 shows a schematic illustration of a detector 100 or current detector for detecting an occurrence of a current strength of interest of a current of a signal to be sensed 102 according to an embodiment. The detector 100 comprises a magnetoresistive structure 110 and a detection unit 120. The detection unit 120 is connected to the magnetoresistive structure 110. The magnetoresistive structure 110 varies a resistance depending on a magnetic field caused by the current of the signal to be sensed. Further, the detection unit generates and provides a current detection signal indicating an occurrence of the current strength of interest or indicating information on whether the current of the signal to be sensed comprises the current strength of interest based on a detected magnitude of the varying resistance of the magnetoresistive structure.

A magnetoresistive structure comprises a very fast response to varying magnetic fields. Therefore, a very fast current detection can be provided by using a magnetoresistive structure. Consequently, an occurrence of a current of interest can be temporally resolved very accurate. In this way, an accurate zero current detection or a detection of shorts can be implemented, for example. Further, a potential separation can be provided easily. Furthermore, the proposed structure can be implemented with low effort.

The magnetoresistive structure 110 can be implemented in various ways. For example, independent from the exact configuration, such a magnetoresistive structure varies the electrical resistance based on a magnetic field applied to the magnetoresistive structure 110. For example, the magnetoresistive structure 110 may comprise at least one magnetic layer (e.g. comprising or consisting of magnetic material). Based on such a magnetic layer, a magnetoresistive structure based on the anisotropic magnetoresistive effect can be implemented. Alternatively, the magnetoresistive structure 110 may comprise at least a non-magnetic layer (e.g. comprising or consisting of non-magnetic material) arranged between a first magnetic layer and a second magnetic layer (or more such layers), so that the resistance of this layer stack varies depending on a magnetic field caused by a current of the signal to be sensed 102. In other words, a magnetoresistive structure 110 may be implemented by a layer stack of alternating magnetic layers (e.g. iron) and non-magnetic layers.

For example, the non-magnetic layer (e.g. chromium) may be an electrically conductive layer, so that the variation of the resistance is based on a giant magnetoresistive effect. Alternatively, the non-magnetic layer may be an electrically insulating layer (e.g. magnesium oxide), so that the variation of the resistance is based on a tunnel magnetoresistive effect.

The electrical resistance of such a magnetoresistive structure 110 varies depending on or as a function of a magnetic field at the position of the magnetoresistive structure 110. The magnetic field may be caused by an arbitrary source. However, a source in the proximity of the magnetoresistive structure contributes a significantly larger portion to the magnetic field at the position of the magnetoresistive structure 110 than sources far away from the magnetoresistive structure 110. Therefore, the magnetoresistive structure 110 may be positioned in the proximity of a signal to be sensed 102. For example, the magnetoresistive structure 110 may be placed closer to an electrically conductive element or line carrying the signal to be sensed 102 than to other sources of magnetic fields, so that the magnetic field at the position of the magnetoresistive structure 110 is mainly (e.g. more than 50%, more than 70% or more than 90%) caused by the current of the signal to be sensed 102.

A higher current results in a higher magnetic field at the position of the magnetoresistive structure 110 and a lower current results in a lower magnetic field at the position of the magnetoresistive structure 110. For example, the magnetoresistive structure 110 may comprise the highest electrical resistance, if no magnetic field exists at the position of the magnetoresistive structure 110. Consequently, such a magnetoresistive structure 110 may comprise the largest electrically resistance, if the signal to be sensed 102 may comprise a zero current state or a zero current crossing.

An example of the dependency of the electrical resistance of a magnetoresistive structure (e.g. in relation to a resistance at zero magnetic field) on a magnetic field at the position of the magnetoresistive structure 110 is shown in FIG. 2a. Three examples for different configurations of magnetoresistive structures 110 are shown. An increase of up to 80% of the resistance in a state with no electric field can be obtained, for example. Alternatively, the magnetoresistive structure 110 may comprise one or more maxima or minima at other non-zero magnetic fields. This may be influenced by the material and the thickness of the layers of the magnetoresistive structure.

Figure 2B:
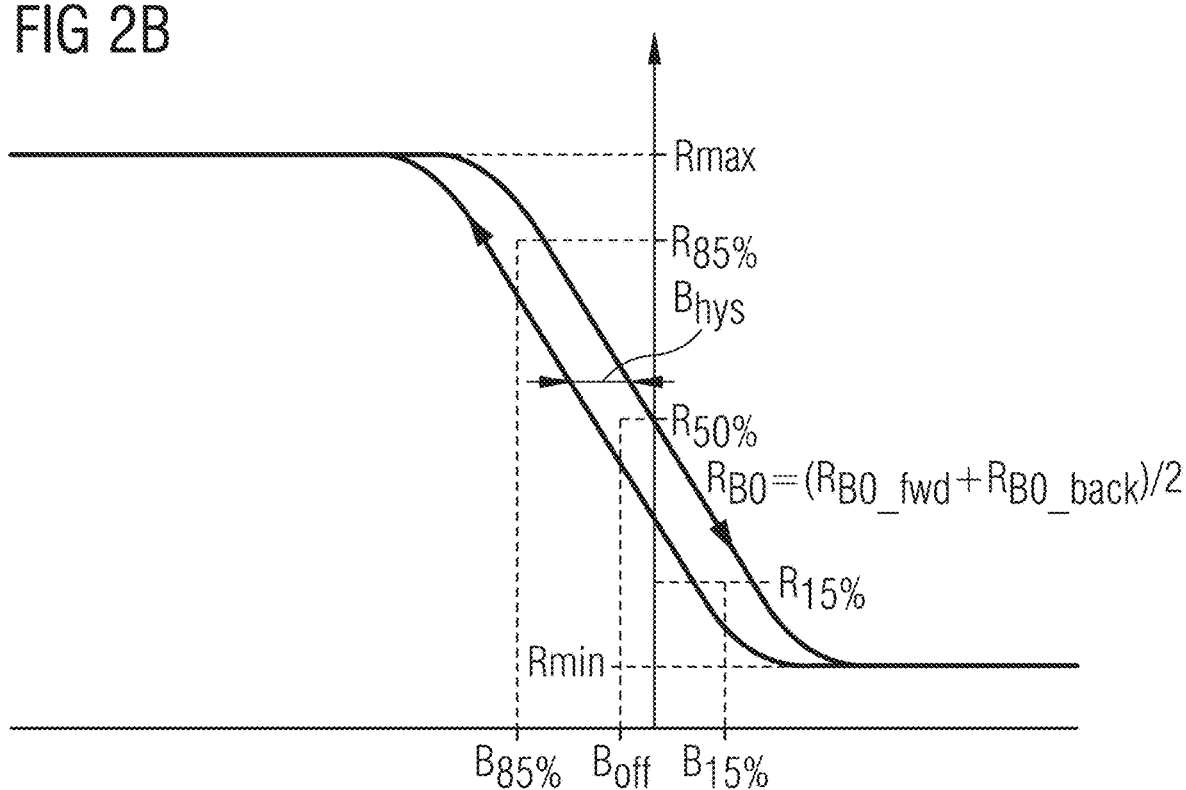
FIG. 2b shows a further schematic illustration of a resistance of a magnetoresistive structure varying depending on an applied magnetic field.

Further, FIG. 2b shows an example of a GMR transfer characteristic with possible hysteresis. The diagram shows the resistance of the GMR structure over the magnetic field at the GMR structure. A range of maximal sensitivity or maximal variation of resistance is obtained between a field strength $B_{15\%}$ indicating a magnetic field causing a resistance $R_{15\%}$ of 15% of a maximal resistance $R_{max}$ of the GMR structure and a field strength $B_{85\%}$ indicating a magnetic field causing a resistance $R_{85\%}$ of 85% of a maximal resistance $R_{max}$ of the GMR structure considering a mean resistance $R_{B0}$ due to hysteresis, for example.

The range of maximal sensitivity may be a magnetic field range comprising a highest variation of the resistance or may comprise an approximately linear variation of the resistance, for example.

In this way, current states (e.g. a predefined current strength, a zero current state or zero current crossings) of arbitrary electrical signals can be sensed and a corresponding current detection signal 122 can be provided.

The current strength of interest of the current of the signal to be sensed 102 may be any current strength reached by the current of the signal to be sensed 102. For example, the current strength of interest may depend on the application of the apparatus 100. For example, the apparatus 100 may be used for detecting a critical current within an electrical circuit or a zero current of a signal. The current detection signal 122 may be used to trigger safety measures, if a critical current strength is detected, or may trigger a switching of a transistor, if a zero current is detected, for example.

The detection unit 120 generates a current detection signal 122 based on a detected magnitude of the varying resistance of the magnetoresistive structure 110. The magnitude of the varying resistance may be a value indicating a size of the resistance of the magnetoresistive structure 110. In other words, the detection unit 120 may repeatedly (e.g. in continuous or random time intervals) measure the resistance of the magnetoresistive structure 110 or may generate a signal indicating the resistance or being proportional or depending on the resistance. Based on this detection of a magnitude of the varying resistance of the magnetoresistive structure 110, a current state within the signal to be sensed 102 can be identified, since the resistance of the magnetoresistive structure 110 depends on the strength of the magnetic field applied to the magnetoresistive structure 110 and the magnetic field depends on the current strength of the signal to be sensed 102.

The zero current detection signal 122 indicates a current strength of interest of the current of the signal to be sensed 102. This information on a current (e.g. zero current state or zero current crossing) can be contained by the current detection signal 122 in various ways. For example, the current detection signal may be a digital or analog signal comprising a peak at the time a detected magnitude of the resistance of the magnetoresistive structure 110 corresponds to the current strength of interest of the current of the signal to be sensed 102.

For example, the detection unit 120 may detect a magnitude of the varying resistance of the magnetoresistive structure 110 by generating a sensor signal indicating the resistance of the magnetoresistive structure 110. The sensor signal may be compared with a predefined threshold indicating a resistance of the magnetoresistive structure 110 at the current strength of interest of the current of the signal to be sensed 102 or close to the current strength of interest of the current of the signal to be sensed 102 (e.g. with a deviation of less than 10%, less than 5% or less than 1% of the resistance of the magnetoresistive structure at the current strength of interest of the current of the signal to be sensed). In other words, the detection unit 120 may measure the electrical resistance of the magnetoresistive structure 110 and may compare the measured resistance with a predefined threshold indicating a reference value representing the resistance at the current strength of interest of the current or close to the current strength of interest of the current. For this, the detection unit 120 may optionally comprise a resistance measurement unit generating the sensor signal and a comparator comparing the sensor signal and the predefined threshold.

It may be sufficient to detect only some of the current states occurring during the temporal course of the signal to be sensed 102. Alternatively, the detection unit 120 may generate the current detection signal 102 indicating a temporal occurrence of each current strength of interest of the current (e.g. zero current crossing) of the signal to be sensed 102. In this way, the temporal occurrence of the current states of the signal to be sensed 102 can be represented or provided by the current detection signal 122.

FIG. 3 shows an example of a signal to be sensed 310 (current over time) and a resulting current detection signal 320 (voltage over time), if the current strength of interest is the zero current of the signal to be sensed 310. The shown example may be a qualitative simulation of a GMR-based zero current detection. The diagram illustrates the signal shapes of the current 310 and a signal 320 equivalent to the resistance variation, for example.

The zero current detector 100 may be used for signals to be sensed 102 comprising current states of interest with low frequencies (e.g. 50 Hz). However, the proposed detector 100 can also be used for signals containing current states of interest with very high frequencies (e.g. more than 1 kHz, more than 100 kHz or more than 1 MHz), since the magnetoresistive structure 110 allows a very fast response to variations of the magnetic field. In other words, the signal to be sensed 102 may comprise current states of interest with a frequency of more than 1 KHz or even more than 1 MHz.

The proposed detector 100 can be used in various configurations. The magnetoresistive structure 110 of the detector 100 can be placed close to an arbitrary electrical conductive element (e.g. wire or electrically conductive line) carrying a signal to be sensed 102. The signal to be sensed 102 and the detector 100 may be part of independent electrical circuits and consequently, the detector 100 may be manufactured independent from the electrical conductive element carrying the signal to be sensed 102.

Alternatively, the detector 100 may be placed on the same semiconductor die as the electrically conductive element carrying the signal to be sensed 102. In other words, the magnetoresistive structure 110 and an electrically conductive line configured to carry the signal to be sensed 102 may be manufactured on the same semiconductor die. In this way, a magnetoresistive structure 110 can be located very close to the signal to be sensed 102 so that an accurately defined environment can be provided and a high accuracy can be obtained. Influences of other sources of magnetic fields may be negligible. Further, the detector 100 and the circuitry of the signal to be sensed can be manufactured commonly so that the costs can be kept low.

FIG. 4*a* shows an example of a schematic cross-section of a semiconductor die 400 illustrating a magnetoresistive structure 410 (XMR) of a detector and an electrically conductive line 420 carrying a signal to be sensed. The magnetoresistive structure 410 is manufactured between an intermetallic oxide layer 430 and a passivation layer 440 of the semiconductor die 400. A part of the electrically conductive line 420 closest to the magnetoresistive structure 410 is manufactured directly below the magnetoresistive structure 410 with the intermetallic oxide layer 430 in between. The semiconductor die 400 may comprise optionally one or more additional metal layers 450 separated by intermetallic oxide layers 460. The layer stack may be manufactured on a semiconductor substrate 470 of the semiconductor die 400, so that a large variety of integrated circuits can be implemented.

FIG. 4*b* shows a detail of the cross-section shown in FIG. 4*a*. The detail shows the magnetoresistive structure 410 (GMR) connected to a metal layer 422 below through a tungsten via 432 (W-via).

The example of FIG. 4*a* and/or FIG. 4*b* may represent a monolithic integration concept for a giant magnetoresistive structure (GMR). It may also be possible to integrate the shown principal in a power switching technology.

The current detection signal 122 may be provided to an external electrical circuit (e.g. manufactured on another semiconductor die) or to an electrical circuit on the same semiconductor die for various purposes.

For example, the detector 100 or an external electrical circuit may comprise a switching element (e.g. a field effect transistor or a bipolar transistor). In this case, the detection unit 120 may provide the current detection signal 122 to the switching element so that a switching of the switching element is triggered by an occurrence of the current strength of interest (e.g. zero current state or zero current crossing) of the current of the signal to be sensed 102. In other words, the detector 100 may detect the temporal occurrence of the current strength of interest of the current states contained by the signal to be sensed 102 in order to synchronize a switching of the switching element with the occurrence of the current states of interest.

Optionally, alternatively or additionally to one or more aspects mentioned above, the detector 100 may provide further information on the signal to be sensed 102 by using the magnetoresistive structure 110. For example, the detection unit 120 may generate a measurement signal indicating information on a magnetic field strength or a current strength of the signal to be sensed 102. The zero current detection signal 122 and the measurement signal may be independent signals or may be the same signal comprising information on the current strength of interest of the current of the signal to be sensed 102 and information on a magnetic field strength or a current strength of the signal to be sensed 102. In this way, the magnetoresistive structure 110 can be used for obtaining more information on the signal to be sensed 102.

Optionally, alternatively or additionally to one or more aspects mentioned above, the magnetoresistive structure 110 may be at least partly surrounded by an inductor carrying the signal to be sensed 102. In other words, the electrically conductive element carrying the signal to be sensed 102 may build-up a coil. The magnetoresistive structure 102 may be placed inside the coil so that the magnetoresistive structure 110 is exposed to the strong electric field inside the inductor. In this way, the occurrence of the current strength of interest of the current state of the signal to be sensed 102 can be detected more accurate, since influences of magnetic fields caused by other sources can be kept low.

Further, the detection unit 120 may optionally generate a status signal indicating a status of the inductor (e.g. saturation of the inductor). Similar to an optional measurement signal, the status signal may be independent from the current detection signal 122 or the current detection signal 122 may additionally include the information of the status signal.

As already mentioned (e.g. FIG. 2*a*, 2*b*), the magnetoresistive structure 102 may comprise a range of maximal sensitivity in various ranges of magnetic fields due to the structure (e.g. layer stack and material selection) of the magnetoresistive structure 102 or a static or dynamic biasing.

In other words, the magnetoresistive structure may be configured so that a magnetic field caused by the current strength of interest of the current of the signal to be sensed lies in a range of maximal sensitivity of the magnetoresistive structure. For example, if the current strength of interest is the zero current, a structure mentioned in connection with FIG. 2*a* may be used. If the current strength of interest is not zero or additional interfering fields may exist at the position of the magnetoresistive structure, a specific magnetic offset may be applied by a applying a magnetic field at the magnetoresistive structure (e.g. sensor). For example, a magnetic element or layer may be arranged in the proximity of the magnetoresistive structure or an electrically conductive element may be arranged in the proximity of the magnetoresistive structure and a bias signal may be applied to the electrically conductive element causing a bias magnetic field.—in this way, the maximal sensitivity of the magnetoresistive structure can be shifted so that so that a magnetic field caused by the current strength of interest of the current of the signal to be sensed lies in a range of maximal sensitivity of the magnetoresistive structure. In this way, the current strength of interest can be detected vary accurate.

Alternatively, the apparatus may comprise an adjustment module configured to adjust a range of maximal sensitivity of the magnetoresistive structure so that a magnetic field caused by the current strength of interest of the current of the signal to be sensed lies in the range of maximal sensitivity of the magnetoresistive structure. For example, the adjustment module may provide the bias signal mentioned above to the electrically conductive element.

Alternatively, the magnetoresistive structure may be implemented by a sensor bridge comprising four magnetoresistive elements R1, R2, R3, R4 as shown in FIG. 4c. Further, an adjustment module 490 may be implemented by a plurality of fuses (e.g. fusible by laser cut or electrically). A first magnetoresistive elements R1 is connected to a supply voltage $V_b$ and to a first differential output $V_n$, a second magnetoresistive elements R2 is connected to ground through a first group of fuses of the adjustment module 490 and to the first differential output $V_n$, a third magnetoresistive elements R3 is connected to the supply voltage $V_b$ through a second group of fuses of the adjustment module 490 and to a second differential output $V_p$ and a fourth magnetoresistive elements R4 is connected to ground and the second differential output $V_p$. The first differential output $V_n$ and the second differential output $V_p$ may be a sensor signal indicating the resistance of the magnetoresistive structure. The fuses may be used to shift the range of maximal sensitivity so that a magnetic field caused by the current strength of interest of the current of the signal to be sensed lies in a range of maximal sensitivity of the magnetoresistive structure. In this way, the current strength of interest can be detected vary accurate.

Figure 4D:
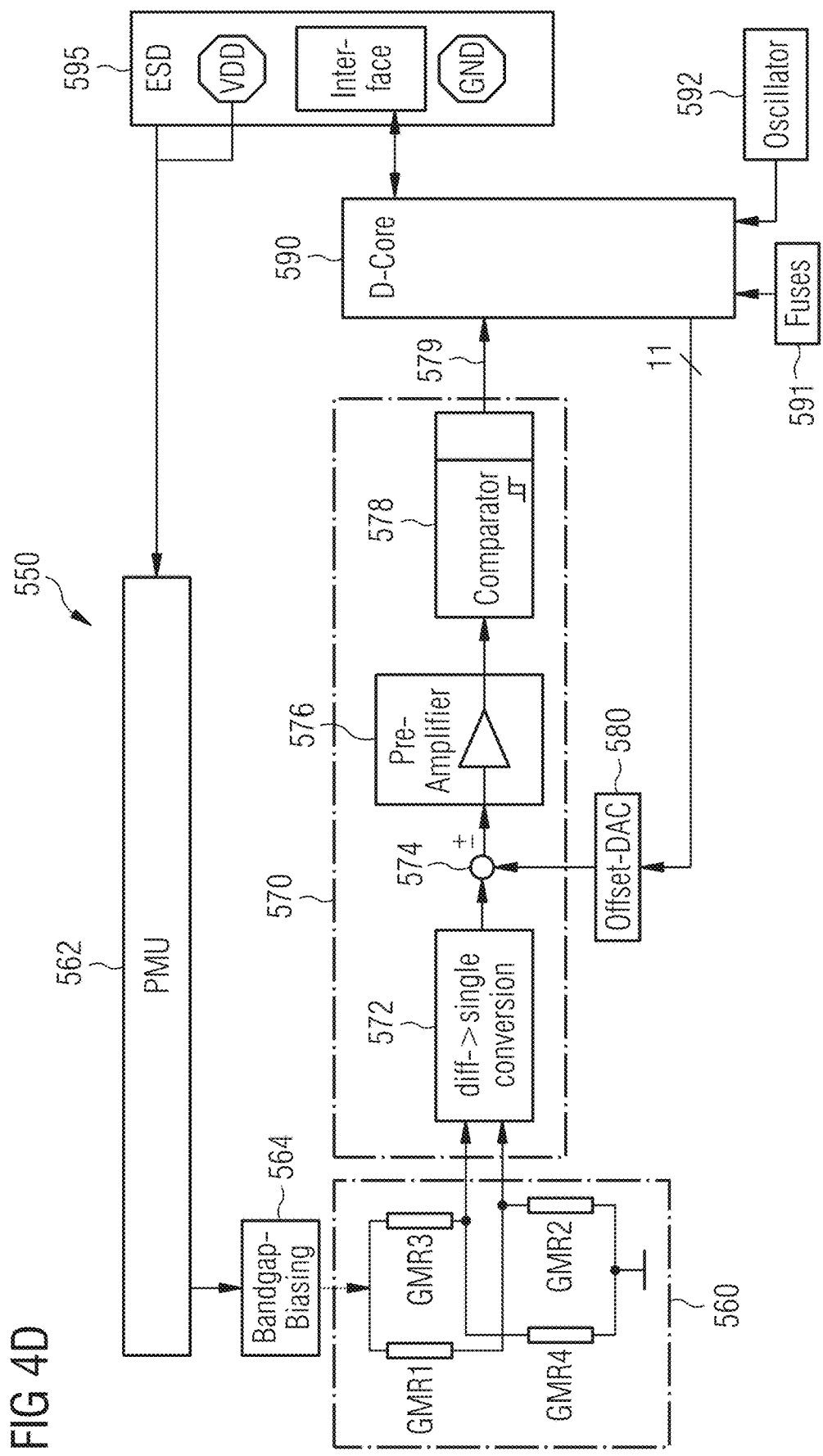
FIG. 4d shows a schematic illustration of an adjustment module for adjusting a range of maximal sensitivity of a magnetoresistive structure.

Alternatively, a variable shift of the range of maximal sensitivity of the magnetoresistive structure may be implemented in order to detect different current strengths of interest by the same circuitry. FIG. 4d shows a detector 550 according to an embodiment. The magnetoresistive structure 560 comprises four magnetoresistive elements GMR1, GMR2, GMR3, GMR4. A first magnetoresistive elements GMR1 (e.g. arranged at a first side, left) is connected to a supply voltage and to a first differential output, a second magnetoresistive elements GMR2 (e.g. arranged at a second side, right) is connected to ground and to the first differential output, a third magnetoresistive elements GMR3 (e.g. arranged at the second side) is connected to the supply voltage and to a second differential output and a fourth magnetoresistive elements GMR4 (e.g. arranged at the first side) is connected to ground and the second differential output.

The first differential output and the second differential output are provided to differential-to-single-conversion module 572 of the detection unit 570 generating a single signal indicating the resistance of the magnetoresistive structure based on the differential signals. The detection unit 570 further comprises a combiner 574 configured to combine the single signal with an adjustment signal (e.g. by adding or subtracting the signals) and a pre-amplifier module 576 for amplifying the combined signal. The amplified signal is provided to a comparator 578 comparing the amplified signal with a predefined threshold (e.g. zero) in order to generate the current detection signal 579 indicating information on whether the current of the signal to be sensed comprises the current strength of interest.

Further, the detector 550 comprises a digital core module 590 providing the current detection signal 579 to an interface module 595 for providing the current detection signal 579. Further, the digital core module 590 may trigger an adjustment module 580 implemented by an offset digital to analog converter (Offset DAC) so that the adjustment module 580 generates an adjustment signal to the combiner 574 in order to shift a range of maximal sensitivity of the magnetoresistive structure. The maximal sensitivity of the magnetoresistive structure may be shifted for different current strengths of interest so that the different current strengths of interest can be detected by a constant predefined threshold used by the comparator 578.

The interface module 595 comprises an interface for providing the current detection signal and for being connected to a ground potential GND and a supply potential VDD. Further, the interface module 595 may comprise elements for ESD (electro static discharge) protection.

The supply voltage VDD may be provided to a power management unit 562 controlling a power supply of the detector 550. For example, the power management unit 562 provides a supply voltage to the magnetoresistive structure 560 through a bandgap-biasing module 564.

FIG. 4d may show an electronic switching point adjustment of a differential GMR based magnetic field switch. This may be a possibility of biasing, which enables an adjustment of the switching point (e.g. of a voltage converter) electronically by an analyzing circuitry. An offset calibration or adjustment of the switching threshold may be implemented. For example, a DAC is used to adjust the switching point by a digital logic. In this way, the switching point can be adjusted also during operation.

For example, the detector 100 may be a zero current detector for detecting a zero current (e.g. representing the current of interest) of a signal to be sensed 102 according to an embodiment. The zero current detector comprises a magnetoresistive structure 110 and a detection unit 120. The detection unit 120 is connected to the magnetoresistive structure 110. The magnetoresistive structure 110 varies its electrical resistance depending on a magnetic field caused by a current of the signal to be sensed 102. The detection unit 120 generates and provides a zero current detection signal 122 indicating a zero current of the signal to be sensed 102 based on a detected magnitude of the varying resistance of the magnetoresistive structure 110.

In this connection, a zero current of a signal may mean a state within the temporal course of the signal 102 with no current flow. For example, for an oscillating signal such a zero current state may be reached at each zero current crossing or zero voltage crossing of the signal. For a direct current (DC) in only one direction, such a zero current state may be reach at times, where no voltage difference is applied to the ends of the electrically conductive line carrying the signal to be sensed 102, for example.

As already mentioned, a proposed detector 100 may be used in various applications. For example, a voltage converter may use the information on zero current states of a signal contained by the zero current detection signal to trigger a voltage conversion of a signal.

Some embodiments relate to a detection of a current strength of interest within a semiconductor device for condition monitoring or triggering of switching or detection of a short. In other words, a semiconductor device may comprise a detector according to the described concept or one or more embodiments above. For example, a power semiconductor device configured to switch a power of more than 1 W, more than 10 W, more than 100 W or more than 1000 W, configured to switch a voltage of more than 10V, more than 100V or more than 1000V or comprising a blocking voltage of more than 10V, more than 100V or more than 1000V may comprises a proposed detector.

For example, an insulated gate bipolar transistor device (IGBT) according to an embodiment may comprise a detector according to the described concept or one or more embodiments above. For example, the magnetoresistive structure is arranged close to a metal layer (e.g. connected to the source regions of the IGBT) of the insulated gate bipolar transistor device so that a short can be detected by the detector.

FIG. 5 shows a schematic illustration of a voltage converter 500 according to an embodiment. The voltage converter 500 comprises an input unit 510, a magnetoresistive structure 520, a detection unit 530 and a converter unit 540. The input unit 510 is connected to the converter unit 540 and the detection unit 530 is connected to the magnetoresistive structure 520 and the converter unit 540. The input unit 510 receives a voltage signal to be converted 502 and the magnetoresistive structure varies a resistance depending on a magnetic field caused by the voltage signal to be converted 502 or a processed signal 512 obtained by processing the voltage signal to be converted 502. Further, the detection unit 530 generates and provides a current detection signal 532 indicating information on whether the current of the voltage signal to be converted 502 or the processed signal 512 obtained by processing the voltage signal to be converted 502 comprises the current strength of interest or indicating an occurrence of the current strength of interest within the voltage signal to be converted or the processed signal obtained by processing the voltage signal to be converted based on a detected magnitude of the varying resistance of the magnetoresistive structure. The current detection signal 532 is generated based on a detected magnitude of the varying resistance of the magnetoresistive structure 520. The converter unit 540 converts the voltage signal to be converted 502 or the processed signal 512 obtained by processing the voltage signal to be converted 502 to a converted voltage signal 542 based on the current detection signal 532.

By using a magnetoresistive structure for detecting the current (e.g. zero current) of a voltage signal or a processed voltage signal to be converted, the current can be detected very accurate and with high temporal resolution. Therefore, the voltage signal can be converted with increased efficiency.

The input unit 510 may be a connector, a pin or an input interface (e.g. pin or ball of a chip package or pad of a semiconductor die) for providing the voltage signal to be converted 502 to the voltage converter 500 and/or the input unit 510 may optionally comprise an input circuitry for pre-processing the voltage signal to be converted 502 (e.g. smoothing the signal). Consequently, the input unit 510 may provide the voltage signal to be converted 502 itself or a processed signal 512 obtained by processing (e.g. smoothing) the voltage signal to be converted 502 to the converter unit 540.

The voltage signal to be converted 502 represents or provides an input voltage to be converted by the voltage converter 500. Further, the converted voltage signal 542 represents or provides an output voltage of the voltage converter 500.

The magnetoresistive structure 520 may be placed along the signal path between the input interface (e.g. before processing) and the converter unit 540 or within the converter unit 540 so that the magnetoresistive structure 520 varies the electrical resistance depending on the current of the voltage signal to be converted 502 or the processed signal 512, for example.

The converter unit 540 converts the voltage signal to be converted 502 or the processed signal 512 based on the current detection signal 532. In other words, the converter unit 540 may convert signals based on the temporal occurrence of current states of interest contained by the voltage signal to be converted 502 or the processed signal 512. The voltage converter 100 may convert the voltage signal to be converted 502 in various ways. For example, the converter unit 540 may rectify the voltage signal to be converted 502 to obtain the converted voltage signal 542.

Additionally, the explanations and description provided in connection with the zero current detector concept or an embodiment and in particular the magnetoresistive structure and/or the detection unit above are also applicable or valid for the voltage converter 500. In other words, the magnetoresistive structure 520 and/or the detection unit 530 may optionally comprise one or more of the mentioned features described in connection with the concept or one or more embodiments mentioned above. In this connection, the voltage signal to be converted 502 or the processed signal 512 may be the signal to be sensed.

For example, the converter unit 540 may comprise at least one switching element configured to switch the voltage signal to be converted 502 or the processed signal 512 obtained by processing the voltage signal to be converted 502. Further, the detection unit 530 may provide the current detection signal 532 to the switching element (e.g. the gate of a transistor) so that the switching of the switching element is triggered by an occurrence of a current strength of interest of the current of the voltage signal to be converted 502 or the processed signal 512 obtained by processing the voltage signal to be converted. In other words, the conversion of the voltage signal to be converted 502 may be done by switching the voltage signal to be converted 502 or the processed signal 512 at times the current detection signal 532 indicates an occurrence of the current strength of interest of the current of the voltage signal to be converted 502 or the processed signal 512. In this way, the conversion of the voltage signal to be converted 502 can be implemented with increased efficiency.

Figure 6A:
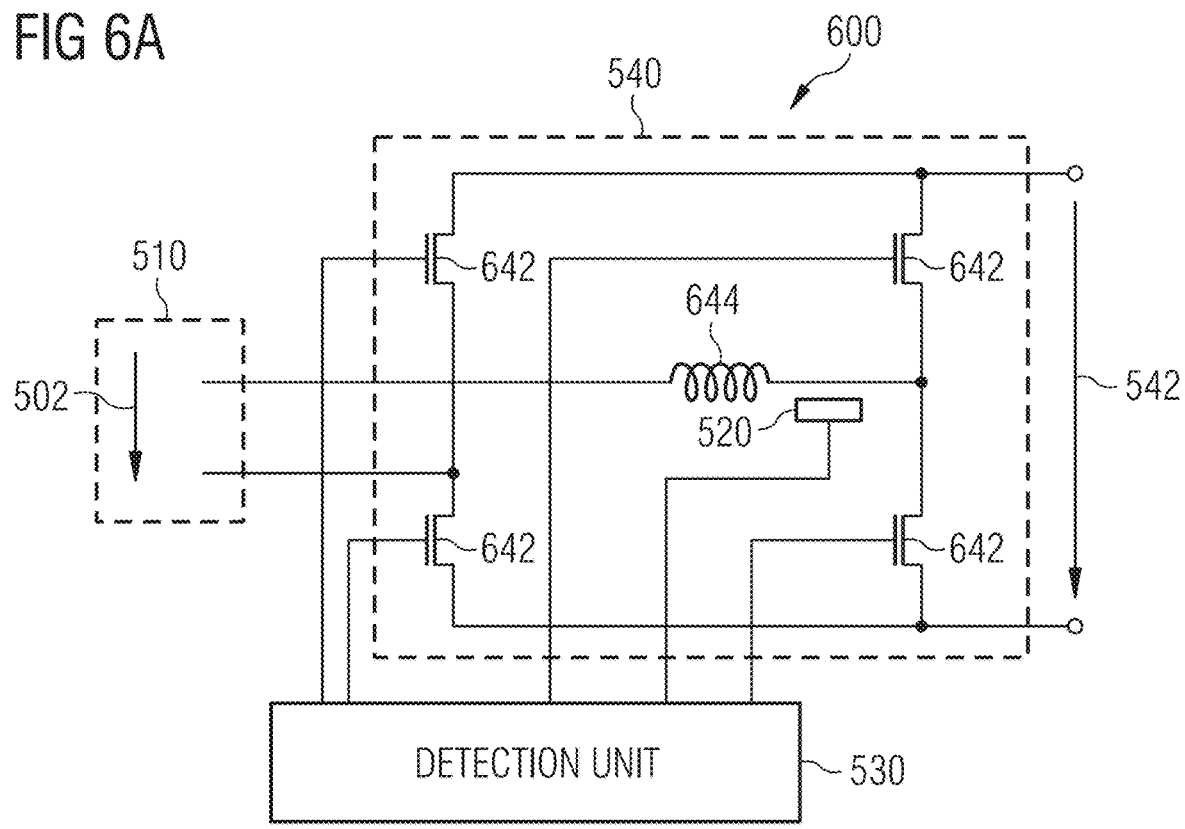
FIG. 6a shows a schematic illustration of another voltage converter.

FIG. 6a shows a schematic illustration of a voltage converter 600 according to an embodiment. The voltage converter 600 comprises an input unit 510 providing an input interface for receiving a voltage signal to be converted. Further, the converter unit 540 is based on an H-bridge configuration. In this example, the converter unit 540 comprises four switching elements 642 (e.g. field effect transistors) and an inductor 644 (e.g. coil) in an H-bridge configuration. The magnetoresistive structure 520 is located inside the converter unit 540 between the inductor 644 and two switching elements 642. Therefore, an already altered and in this way processed signal obtained by processing (e.g. at least by the inductor) the voltage signal to be converted is sensed by the magnetoresistive structure 520. The detection unit 530 provides a current detection signal or a signal derived from the current detection signal (e.g. by shifting the phase) to the switching element 642 so that the switching of the switching element 642 is triggered by the detection unit 530. The converter unit 540 provides the converted voltage signal 542 as an output. For example, the current strength of interest is the zero current so that the switching of the switching element 642 is triggered, if a zero current state occurs.

The switching elements 642 may be power transistors, for example. The converter unit 540 may optionally comprise a driver circuitry for generating the gate voltages of the power transistors based on the current detection signal provided by the detection unit 530.

FIG. 6a shows an example for a measurement principle at a topology without a transformer for a power factor correction (PFC).

Similarly, the proposed principle can be applied to topologies using a transformer for controlling secondary side power elements. FIG. 6a shows a schematic illustration of a voltage converter 650 according to an embodiment. The voltage converter 650 comprises an input unit 660 providing an input interface for receiving a voltage signal to be converted from an external voltage source 658. Further, the input unit comprises a first transistor Q1 and a second transistor Q2, a first inductor $L_r$, a second inductor $L_m$ and a capacitor $C_r$. The converter unit 690 comprises a transformer TX connected to the input unit 660, a first transistor S1, a second transistor S2 (synchronous rectifier transistors) and an output capacitor $C_o$. The converter unit 690 provides the converted voltage signal $V_o$ to an external load $R_L$. The transformer TX comprises a primary side inductor and a secondary side inductor. The primary side inductor and the input unit 660 represent the primary side of the voltage converter 650 and the remaining part of the converter unit 690 represent the secondary side of the voltage converter 650. The first transistor S1 of the voltage converter 650 is connected to a first terminal of the secondary side inductor and the second transistor S2 is connected to a second terminal of the secondary side inductor. A first magnetoresistive structure 670 is arranged in the proximity of the electrical connection between the second transistor S2 and the secondary side inductor and a second magnetoresistive structure 672 is arranged in the proximity of the electrical connection between the first transistor S1 and the secondary side inductor. Therefore, an already altered and in this way processed signal obtained by processing (e.g. at least by the inductor) the voltage signal to be converted is sensed by the magnetoresistive structure 520. The detection unit 680 (e.g. one unit for both magnetoresistive structures or two independent units for the magnetoresistive structures) provides a current detection signal or a signal derived from the current detection signal (e.g. by shifting the phase) to the first transistor S1 and the second transistor S2 so that the switching of the switching element 642 is triggered by the detection unit 530 (e.g. at a zero current occurring at the electrical connections in the proximity of the magnetoresistive structures).

Figure 6B:
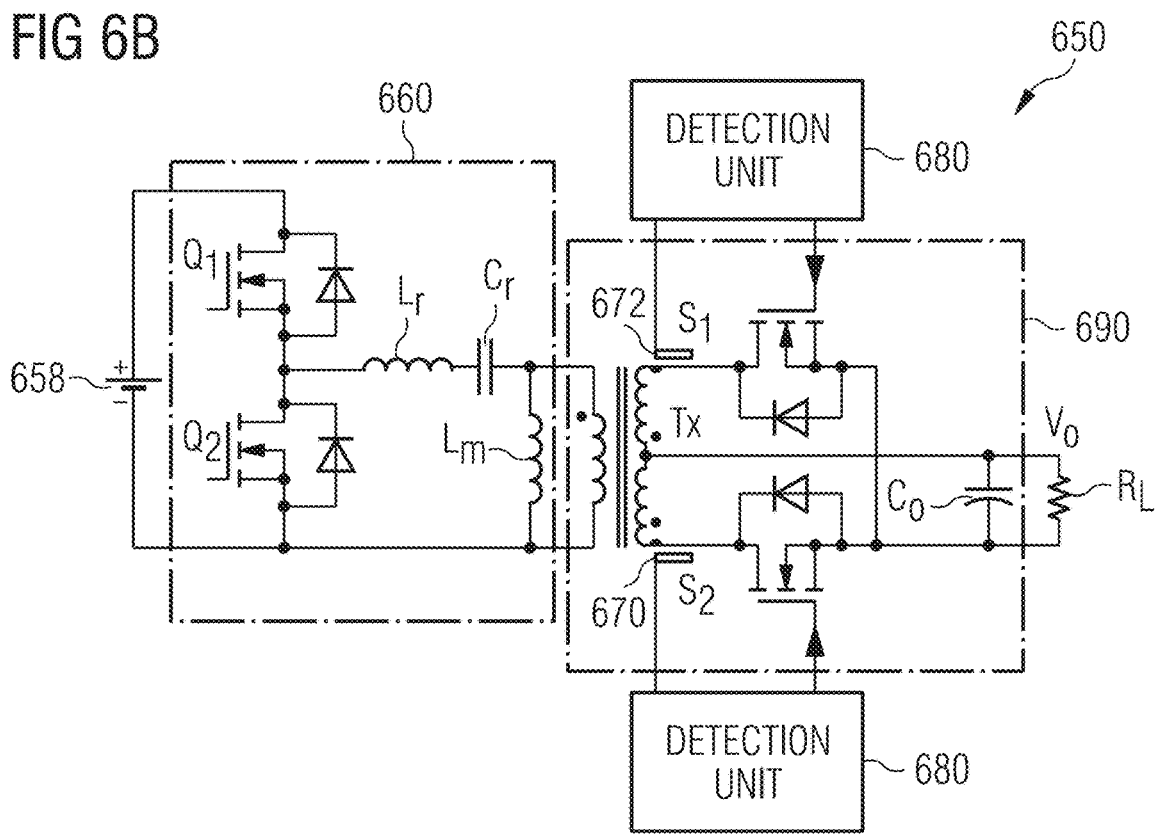
FIG. 6b shows a schematic illustration of another voltage converter.

FIG. 6b illustrates a secondary side controlling of the synchronous rectifier (SR) transistors. Due to the magnetoresistive structures (e.g. GMR sensors) arranged in the proximity of the SR transistors S1, S2, a very accurate zero current detection can be implemented.

Further, a falsification of the duty cycle by the package inductivity may be avoided by using the proposed concept due to the integrated current measurement. Furthermore, the current within the loop may be equal in comparison to a voltage measurement.

Some embodiments relate to a detection of a threshold for protection monitoring of electronic power devices. For example, a fast short circuit monitoring of an insulated gate bipolar transistor may be implemented with a detector according to the described concept or one or more embodiments described above. By using a magnetoresistive structure for current detection, a detection within 1 µs or below may be possible.

Figure 7A:
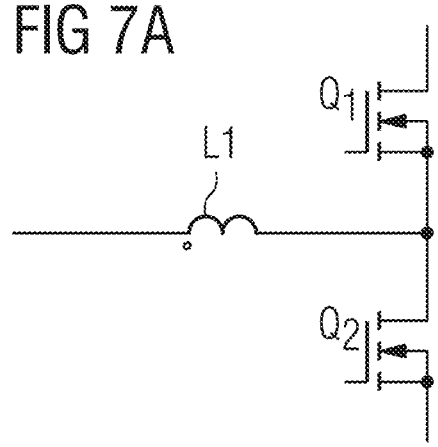
FIG. 7a shows a part of a voltage converter.
Figure 7B:
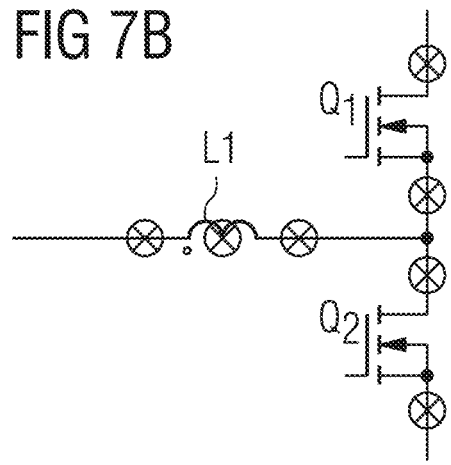

As already mentioned, the magnetoresistive structure 520 can be placed at various locations. FIG. 7a shows a detail of a part of the H bridge of the converter unit 540 shown in FIG. 6. This part comprises an inductor L1, a first transistor Q1 and a second transistor Q2. The inductor L1 is connected to a source of the first transistor Q1 and a drain of the second transistor Q2. Corresponding to the part of the H bridge shown in FIG. 7a, FIG. 7b shows possible locations for the magnetoresistive structure indicated by a cross in a circle. The magnetoresistive structure may be located in the proximity of an electrically conductive line (e.g. the electrically conductive line closest to the magnetoresistive structure) configured to carry the voltage signal to be converted or the processed signal obtained by processing the voltage signal to be converted. The electrically conductive line may be connected to a source or drain of a switching element, connected to an inductor or builds up a coil of an inductor (e.g. the magnetoresistive structure may be at least partly surrounded by the inductor), for example.

In this way, the magnetoresistive structure can be placed close to the switching element so that the occurrence of the current strength of interest can be detected close to the switching element and the switching of the switching elements can be synchronized very accurate.

Some embodiments relate to a detection of a current strength of interest within a voltage converter for condition monitoring or triggering of switching. In other words, a voltage converter may comprise a detector according to the described concept or one or more embodiments above. For example, a voltage converter as described above may be configured to convert a power of more than 1 W, more than 10 W, more than 100 W or more than 1000 W, may be configured to switch a voltage of more than 10V, more than 100V or more than 1000V or may comprising a blocking voltage of more than 10V, more than 100V or more than 1000V may comprises a proposed detector.

Some embodiments relate to the use of a magnetoresistive structure for carrying out a current detection of a signal to be sensed. In other words, a method for detecting an occurrence of a current strength of interest of a current of a signal to be sensed may comprise carrying out a detection of the current strength of interest of the current of the signal to be sensed with a magnetoresistive structure configured to vary a resistance depending on a magnetic field caused by a current of the signal to be sensed.

Figure 8:
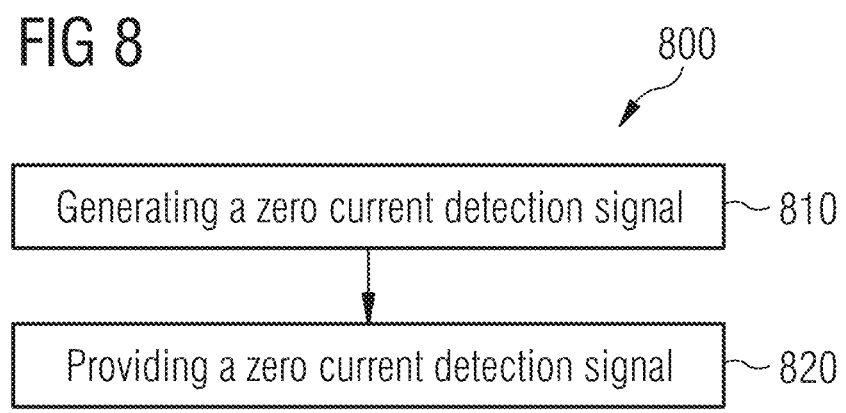
FIG. 8 shows a flowchart of a method for carrying out the zero current detection.

FIG. 8 shows a flowchart of a method 800 for detecting a zero current of a signal to be sensed according to an embodiment. The method 800 comprises generating 810 a zero current detection signal indicating a zero current of the signal to be sensed based on a detected magnitude of a varying resistance of a magnetoresistive structure. The resistance of the magnetoresistive structure varies depending on a magnetic field caused by a current of the signal to be sensed. Further, the method 800 comprises providing 820 the zero current detection signal.

The method 800 may comprise one or more further optional steps corresponding to one or more aspects mentioned in connection with the concept or one or more embodiments described above.

Some embodiments relate to a giant magnetoresistance (GMR) based current detection or zero current detection in switched circuits. A GMR-sensor may be suitable for detecting zero current crossings due to the non-linear characteristic (e.g. shown in FIG. 2), for example.

With the proposed implementation, a loss-free measurement with inherent galvanic isolation, high bandwidth, high sensitivity, low construction space, high input current range and/or good thermal stability may be provided.

The measurement of the zero current crossing of a current can be done through the magnetic field generated by the conductor with a GMR-based sensor. For example, an idle current measurement through the magnetic field may be possible.

The GMR technology comprises an extremely high bandwidth (e.g. also applicable for hard disk drives). GMR sensors may provide the possibility of switching times in the range of nanoseconds. Additionally, it may be possible to detect the zero current of the magnetic flux within a magnetic component due to the application of the magnetic measurement principal. This may improve the sensitivity.

The proposed sensor functionality may be integrated in digital controllers as well for implementing a digital platform for power electronics, for example.

The proposed concept may be used for bridgeless power factor correction (PFC) applications, for example. Further, also a direct current measurement (DC) may be possible.

FIG. 7b illustrates application possibilities of a GMR-based zero current detection in an H bridge as already mentioned. Due to an application of a measurement structure at drain or source of the power transistor, operating conditions critical for efficient transistors can be avoided additionally to an increase of the efficiency, for example.

Additionally to the implementation of a zero current detection similar to the example shown in FIG. 6, it is possible to use the sensors for a resonant zero current switching (ZCRS) and/or even to be integrated in the power semiconductor as shown in FIG. 4a, for example. Therefore, additionally to a discretely constructed zero current detection, there may be the possibility to integrate a GMR zero current switch in the process flow of a single semiconductor as shown by the monolithic (XMR) integration concept shown in FIG. 4a, for example. Alternatively, the zero current detector including an analysis circuit (e.g. the detection unit of the zero current detector) may be integrated in one package with the driver (e.g. driver circuit for the gates of the power transistors) by means of a system on package (SoP) strategy and by a corresponding logic interconnection between the zero current detection and the driving signal in order to provide a switching at zero current, for example.

The magnetoresistive structure may also be used for generating a calibration signal for calibrating the zero current detector and/or a circuitry using the zero current detector (e.g. a voltage converter).

The GMR may comprise a hysteresis. This hysteresis may be kept very low. An example is shown in FIG. 3. Further, for such an application, the GMR structure may saturate very fast.

In this example, the variation of the resistance comprises the same algebraic sign for currents in different directions. However, the different current directions can be differentiated easily due to the inherent current measurement function, for example.

The proposed zero current detection may provide a galvanic isolation. Further, no current flow through the sensor may be required, a combination with a magnetic field measurement may be possible (detection of a core saturation), a technological integration in the processing of a single semiconductor may be possible, the integration of the analysis electronic may be easily possible also in combination with logic for driving the gates (locking the gates), a signal amplifying at the zero crossing and/or a simultaneous measurement of the current may be possible. Further, it may be possible to use a magnetic field measurement within a magnetic component for the zero current measurement and optionally also a simultaneous measurement of the magnetic properties within a coil (core saturation) may be possible by integrating the GMR technology on one chip. Furthermore, a combination with fast logic and digital functionality is possible due to the integrated GMR technology. Further, an implementation based on tunnel magnetoresistive structures may be also possible, which may provide higher sensitivity and lower hysteresis.

In addition to a detection of zero crossings, a detection of preset current values beyond the zero crossings may be possible by a suitable biasing of the GMR sensor. A biasing may be achieved by a reference current through a nearby conductor, for example. A conductor may be arranged in the proximity of the magnetoresistive structure (xmr sensor) similar to the examples shown in FIGS. 4a and 4b.

A parameterization of the zero current crossings or the switching points of a GMR switching element may be done in order to detect and/or calibrate thresholds and the accurate zero crossing. There are various possibilities for changing the switching point of a GMR.

For example, the characteristic can be shifted up or down (biasing) by technological measures. The required zero point may be set by different layer thicknesses or layer shapes, for example. This biasing may be implemented with low effort, but may be fixed after production and may not be changeable anymore.

A sensor circuit may also be trimmed by fusing (specific cut off of predefined circuit parts, e.g. by means of industrial lasers). FIG. 4c shows an example of a bridge circuit comprising a bridge to be trimmed by means of laser fuses. This laser-trimmable GMR sensor bridge is an example for a biasing by semiconductor calibration measures.

This trimming may also be done by other possibilities of trimming as, for example, a transistor driven through an EEPROM (electrically erasable programmable read-only memory) or a transistor comprising a gate to be destroyed (e.g. SIDENSE principle).

An integration of the system power transistor, driver, current sensor and controller in one package may be possible due to the integration of a GMR on power transistors, for example.

Embodiments may further provide a computer program having a program code for performing one of the above methods, when the computer program is executed on a computer or processor. A person of skill in the art would readily recognize that steps of various above-described methods may be performed by programmed computers. Herein, some embodiments are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. The embodiments are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

Functional blocks denoted as "means for . . . " (performing a certain function) shall be understood as functional blocks comprising circuitry that is configured to perform a certain function, respectively. Hence, a "means for s.th." may as well be understood as a "means configured to or suited for s.th.". A means configured to perform a certain function does, hence, not imply that such means necessarily is performing the function (at a given time instant).

Functions of various elements shown in the figures, including any functional blocks labeled as "means", "means for providing a sensor signal", "means for generating a transmit signal.", etc., may be provided through the use of dedicated hardware, such as "a signal provider", "a signal processing unit", "a processor", "a controller", etc. as well as hardware capable of executing software in association with appropriate software. Moreover, any entity described herein as "means", may correspond to or be implemented as "one or more modules", "one or more devices", "one or more units", etc. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

What is claimed is:

1. A voltage converter comprising:
    an input configured to receive a voltage signal to be converted;
    a magnetoresistive structure configured to vary a resistance depending on a magnetic field caused by the voltage signal to be converted or a processed signal obtained by processing the voltage signal to be converted;
    a detector configured to selectively generate and provide, when a detected magnitude of the varying resistance of the magnetoresistive structure indicates an occurrence of a current strength of interest within the voltage signal or the processed signal, a current detection signal indicating the occurrence of the current strength of interest; and
    a converter configured to covert the voltage signal to be converted or the processed signal obtained by processing the voltage signal to be converted to a converted voltage signal based on the current detection signal.

2. The voltage converter according to claim 1, wherein the converter comprises:
    at least one switch configured to switch the voltage signal to be converted or the processed signal obtained by processing the voltage signal to be converted, and
    wherein the detector is configured to provide the current detection signal to the at least one switch so that a switching of the at least one switch is triggered by an occurrence of the current strength of interest of the current of the voltage signal to be converted or the processed signal obtained by processing the voltage signal to be converted.

3. The voltage converter according to claim 2, wherein the magnetoresistive structure is located in the proximity of an electrically conductive line configured to carry the voltage signal to be converted or the processed signal obtained by processing the voltage signal to be converted, and
    wherein the electrically conductive line is connected to a source or drain of the at least one switch, and is connected to an inductor or builds up a coil of an inductor.

4. The voltage converter according to claim 1, wherein the voltage converter is configured to rectify the voltage signal to be converted.

5. The voltage converter according to claim 1, configured to convert a power of more than 1 W.

6. The voltage converter according to claim 1, wherein the current strength of interest is a zero current.

7. The voltage converter according to claim 1, wherein the detector is further configured to generate an adjustment signal based on the current detection signal and a sensitivity of the magnetoresistive structure, and to generate the current detection signal based on the detected magnitude of the varying resistance of the magnetoresistive structure and the adjustment signal.

8. The voltage converter according to claim 1, wherein the current detection signal comprises a peak, a pulse, a rising signal edge, or a falling signal edge at a time when the detected magnitude of the varying resistance of the magnetoresistive structure corresponds to the current strength of interest of the current signal to be sensed.

9. The voltage converter according to claim 1, wherein the current detection signal comprises a detectable characteristic at a time when the detected magnitude of the varying resistance of the magnetoresistive structure corresponds to the current strength of interest of the current signal to be sensed.

10. The voltage converter according to claim 7, wherein the detector further comprises an adjuster configured to adjust the adjustment signal based on the sensitivity of the magnetoresistive structure to a range of maximal sensitivity of the magnetoresistive structure so that a magnetic field caused by the current strength of interest of the current signal lies in the range of maximal sensitivity of the magnetoresistive structure.

11. The voltage converter according to claim 1, wherein the magnetoresistive structure comprises at least a non-magnetic layer arranged between a first magnetic layer and a second magnetic layer so that the resistance of this layer stack varies depending on a magnetic field caused by a current of the signal to be sensed.

12. The voltage converter according to claim 11, wherein the non-magnetic layer is an electrically conductive layer such that the variation of the resistance is based on a giant magnetoresistive effect, or the non-magnetic layer is an electrically insulating layer such that the variation of the resistance is based on a tunnel magnetoresistive effect.

13. The voltage converter according to claim 1, wherein the magnetoresistive structure and an electrically conductive line configured to carry the signal to be sensed are manufactured on a same semiconductor die.

14. A voltage converter comprising:
    an input configured to receive a voltage signal to be converted;
    a magnetoresistive structure configured to vary a resistance based on a magnetic field associated with the voltage signal;
    a detector configured to detect a magnitude of the varying resistance of the magnetoresistive structure and to selectively generate, when the detected magnitude of the varying resistance of the magnetoresistive structure indicates an occurrence of a current strength of interest within the voltage signal, a current detection signal indicating the occurrence of the current strength within the voltage signal; and
    a converter configured to covert the voltage signal to a converted voltage signal based on the current detection signal.

15. The voltage converter according to claim 14, wherein the converter comprises:
    at least one switch configured to switch the voltage signal to be converted, wherein the detector is configured to provide the current detection signal to the at least one switch so that a switching of the at least one switch is triggered by an occurrence of the current strength.

16. The voltage converter according to claim 15, wherein the magnetoresistive structure is located in the proximity of an electrically conductive line configured to carry the voltage signal to be converted, and
    wherein the electrically conductive line is connected to a source or drain of the at least one switch, and is connected to an inductor or builds up a coil of an inductor.

17. The voltage converter according to claim 14, wherein the current strength is a zero current strength.

18. The voltage converter according to claim 14, wherein:
    the detector is further configured to generate an adjustment signal based on a sensitivity of the magnetoresistive structure, and to generate the current detection signal based on the detected magnitude of the varying resistance of the magnetoresistive structure and the adjustment signal.

19. The voltage converter according to claim 18, wherein the detector is configured to generate the adjustment signal based on the sensitivity of the magnetoresistive structure and the current detection signal.

20. The voltage converter according to claim 18, wherein the detector is further configured to adjust the adjustment signal based on the sensitivity of the magnetoresistive structure to a range of maximal sensitivity of the magnetoresistive structure so that a magnetic field caused by the current strength of the current signal lies in the range of maximal sensitivity of the magnetoresistive structure.

* * * * *